United States Patent
Chen et al.

(10) Patent No.: US 8,836,385 B2
(45) Date of Patent: Sep. 16, 2014

(54) FREQUENCY CONVERTER AND SWITCHING METHOD THEREOF

(71) Applicant: Industrial Technology Research Institute, Hsinchu (TW)

(72) Inventors: Keng-Yuan Chen, Hsinchu (TW); Jwu-Sheng Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/054,682

(22) Filed: Oct. 15, 2013

(65) Prior Publication Data

US 2014/0153309 A1    Jun. 5, 2014

(30) Foreign Application Priority Data

Dec. 5, 2012 (TW) ............................ 101145744 A

(51) Int. Cl.
*H03B 19/00* (2006.01)
*H02M 5/04* (2006.01)

(52) U.S. Cl.
CPC ........................................ *H02M 5/04* (2013.01)
USPC .......................................................... 327/113

(58) Field of Classification Search
USPC .......................................................... 327/113
See application file for complete search history.

(56) References Cited

U.S. PATENT DOCUMENTS

| | | | |
|---|---|---|---|
| 5,304,913 A | 4/1994 | Anticole | |
| 5,442,540 A | 8/1995 | Hua et al. | |
| 5,661,382 A | 8/1997 | Enami et al. | |
| 5,706,186 A | 1/1998 | Blasko | |
| 6,023,417 A | 2/2000 | Hava et al. | |
| 2002/0044472 A1 | 4/2002 | Arnet et al. | |
| 2008/0049478 A1* | 2/2008 | Wong et al. | ............ 363/132 |
| 2008/0162963 A1 | 7/2008 | Kung et al. | |
| 2009/0309564 A1 | 12/2009 | Zafarana et al. | |
| 2010/0013554 A1 | 1/2010 | Park | |

FOREIGN PATENT DOCUMENTS

| | | |
|---|---|---|
| TW | I253234 | 4/2006 |
| TW | I392214 | 4/2013 |
| TW | I404320 | 8/2013 |

OTHER PUBLICATIONS

Pickert, et al., "Three-phase soft-switching voltage source converters for motor drives. Part 1: Overview and analysis", IEEE Proc.-Electr. Power Appln., vol. 146, No. 2, Mar. 1999, pp. 147-154.
Chao, et al., "Three-phase soft-switching inverter for induction motor drives", IEEE Proc.-Electr. Power Appln., vol. 148, No. 1, Jan. 2001, pp. 8-20.
Trzynadlowski, et al., "Space Vector PWM Technique with Minimum Switching Losses and a Variable Pulse Rate", IEEE Transactions on Industrial Electronics, vol. 44, No. 2, Apr. 1997, pp. 173-181.

(Continued)

*Primary Examiner* — Daniel Rojas
(74) *Attorney, Agent, or Firm* — Muncy, Geissler, Olds & Lowe, P.C.

(57) ABSTRACT

A frequency converter includes a comparator, an error computation unit and a calibration unit. The comparator receives a reference voltage signal and a triangle wave signal, and outputs a switching signal. The switching signal is fed back to the error computation unit to calculate an error signal by computing the reference signal and the switching signal. The calibration unit calibrates the triangle wave signal or the reference voltage signal according to the error signal.

18 Claims, 6 Drawing Sheets

(56) References Cited

OTHER PUBLICATIONS

Zhao, et al., "Space-Vector-Based Hybrid Pulsewidth Modulation Techniques for Reduced Harmonic Distortion and Switching Loss", IEEE Transactions On Power Electronics, vol. 25, No. 3, Mar. 2010, pp. 760-774.

Trzynadlowski, et al., "Minimum-Loss Vector PWM Strategy for Three-Phase Inverters", IEEE Transactions on Power Electronics, vol. 9, No. 1, Jan. 1994, pp. 26-34.

Hava, et al., "A High-Performance Generalized Discontinuous PWM Algorithm", IEEE Transactions on Industry Applications, vol. 34, No. 5, Sep./Oct. 1998, pp. 1059-1071.

\* cited by examiner

S1

S1'

S1'

S1'

FREQUENCY CONVERTER AND SWITCHING METHOD THEREOF

This application claims the benefit of Taiwan application Serial No. 101145744, filed Dec. 5, 2012, the disclosure of which is incorporated by reference herein in its entirety.

TECHNICAL FIELD

The disclosure relates in general to an electronic device and control method thereof, and more particularly to a frequency converter and switching method thereof.

BACKGROUND

Total harmonic distortion is one of the critical specifications in safety standards in products associated with frequency converters, and a switching strategy is the mainly cause of effecting the harmonic distortion. A common frequency converter operates on a switching strategy of a pulse width modulator (PWM). The switching number and tracking accuracy of the modulator are positively correlated. In order to improve tracking accuracy, the switching frequency of the frequency converter is often increased, so that the system switching loss is increased.

Therefore, there is a need for switching strategy circuit having an enhanced system tracking accuracy without increasing the switching frequency.

SUMMARY

The disclosure is directed to a frequency converter and switching method thereof.

According to one embodiment, a switching method for a frequency converter is provided. The switching method includes the following steps. A reference voltage signal and then a triangle wave signal are received by a comparator. A switching signal is outputted by the comparator. The switching signal is fed back to calculate an error signal by computing the reference voltage signal and the switching signal. The triangle wave signal or the reference signal is calibrated according to the error signal.

According to another embodiment, a frequency converter is provided. The frequency converter includes a comparator, an error computation unit and a calibration unit. The comparator receives a voltage reference signal and a triangle wave signal, and outputs a switching signal. The switching signal is fed back to the error computation unit to calculate an error signal by computing the reference voltage signal and the switching signal. The calibration unit calibrates the triangle wave signal or the reference voltage signal according to the error signal.

Figure 1:
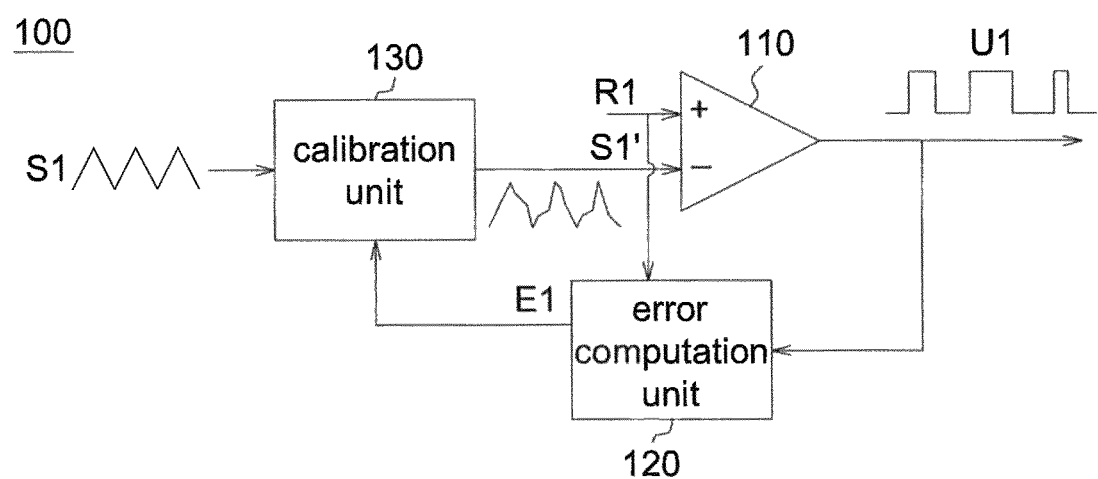
FIG. 1 is a schematic diagram of a frequency converter according to a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

First Embodiment

Referring to FIG. 1, FIG. 1 shows a schematic diagram of a frequency converter 100 according to a first embodiment. The frequency converter 100 includes a comparator 110, an error computation unit 120 and a calibration unit 130. The comparator 110 outputs a signal having a different voltage result at an output end through comparing magnitude of currents or voltages of two signals inputted at input ends. The comparator 110 is often utilized in a modulus converter circuit.

The error computation unit 120 calculates an error between the signals at two input ends. The calibration unit 130 calibrates the signal at one input end according to the signal at the other input end. For example, the error computation unit 120 and the calibration unit 130 are a chip, a firmware circuit or a storage medium storing multiple codes. In one embodiment, the error computation unit 120 and the calibration unit 130 may be integrated into one component.

Through the feedback computation and calibration of the first embodiment, the frequency converter 100 may be prevented from generating total harmonic distortion while also reducing switching losses. A switching method for the frequency converter 100 shall be described in detail with reference to a flowchart below.

Figure 2:
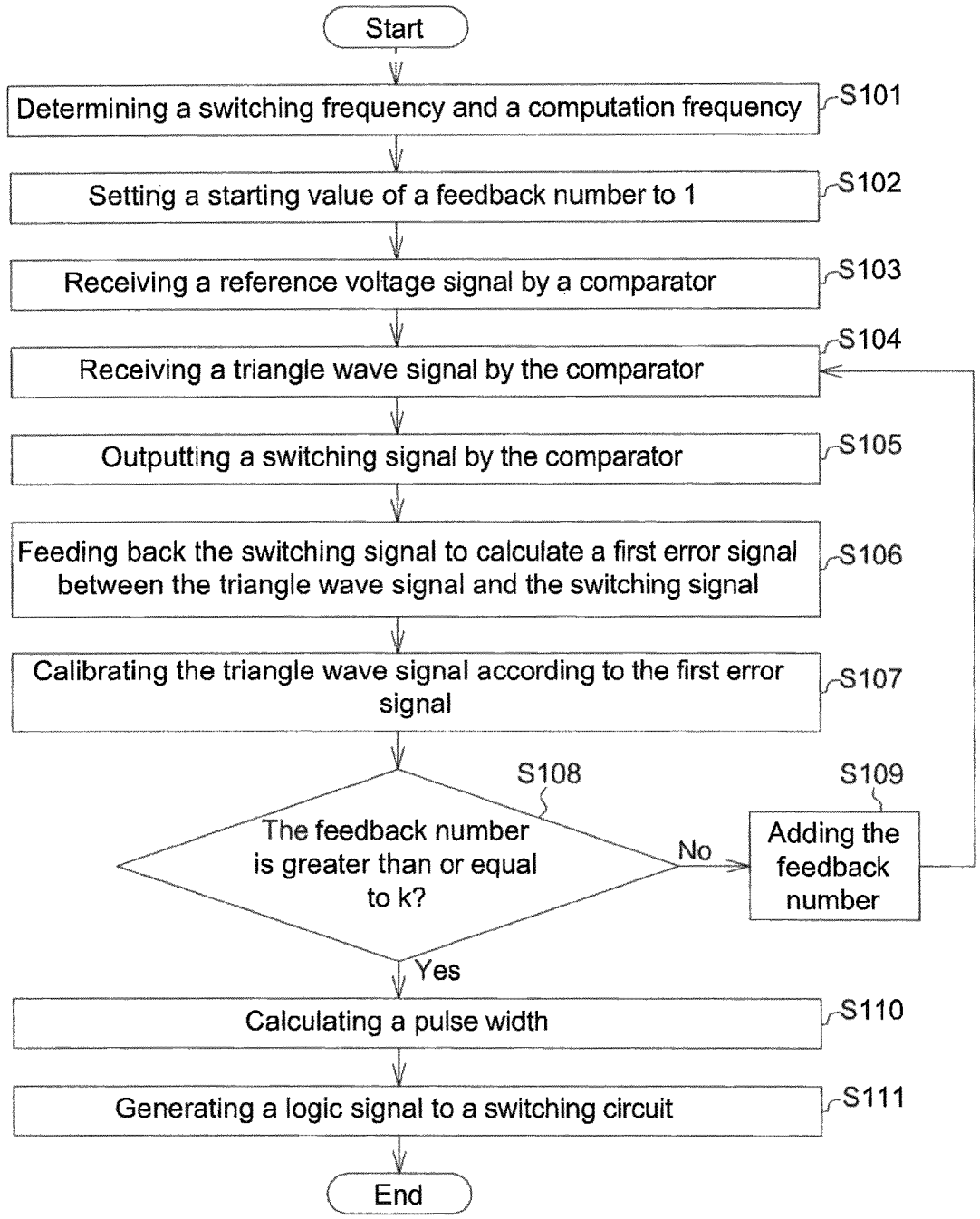
FIG. 2 is a flowchart of a switching method for the frequency converter in FIG. 1.

Referring to FIG. 2, FIG. 2 shows a flowchart of a switching method for the frequency converter 100 in FIG. 1. In step S101, a switching frequency and a computation frequency are determined.

In step S102, a starting value of a feedback number is set to 1.

Figure 3A:
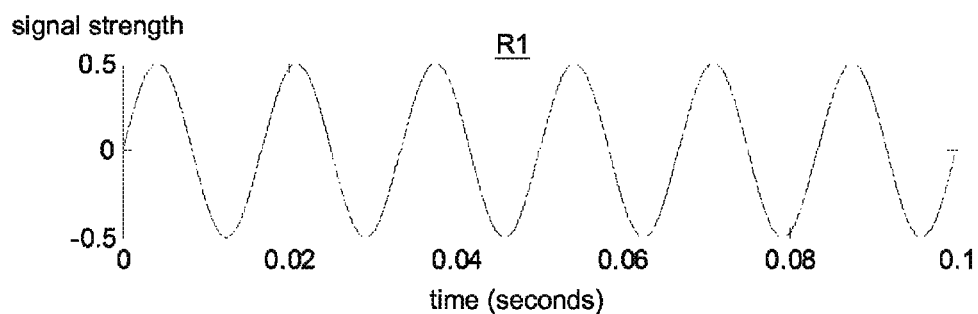
FIG. 3A is a waveform of a reference voltage signal.

In step S103, a reference voltage signal is received by the comparator 110. Referring to FIG. 3A showing a waveform of a reference voltage signal R1, the reference voltage signal R1 is a sine wave, for example.

In step S104, a triangle wave signal S1 is received by the comparator 110. Before being fed back and calibrated, the triangle wave signal S1 is predetermined as a symmetrical and periodical changing form.

In the embodiment, the switching frequency of the triangle wave signal S1 is a constant frequency.

Figure 3B:
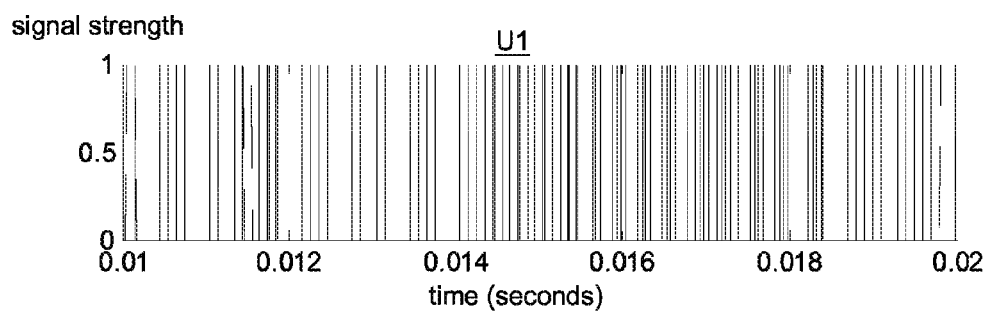
FIG. 3B is a waveform of a switching signal.

In step S105, a switching signal U1 is outputted by the comparator 110. Before feeding back and calibrating the triangle wave signal S1, the switching signal U1 outputted for the first time has a less satisfactory accuracy and contains total harmonic distortion. FIG. 3B shows a waveform of the switching signal U1. For easily understanding, only a part (0.01 to 0.02 seconds) of the switching signal U1 is depicted in FIG. 3B.

Figure 3C:
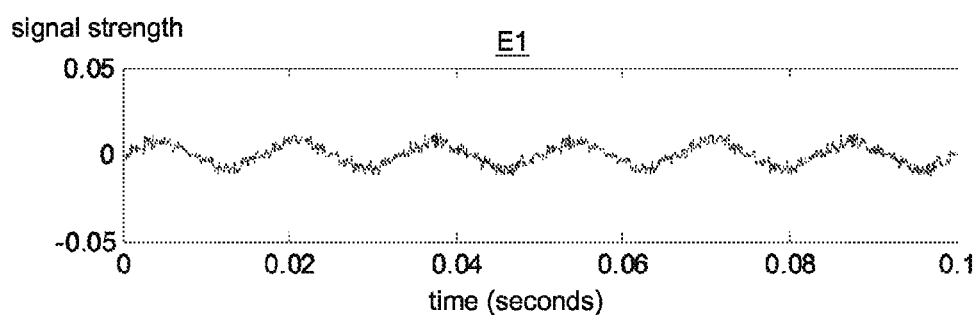
FIG. 3C is a waveform of a first error signal.

In step S106, the switching signal U1 is fed back to the error computation unit 120 to calculate a first error signal E1 by computing the reference voltage signal R1 and the switching signal U1. FIG. 3C shows a waveform of the first error signal E1. For example, the error computation unit 120 calculates the first error signal through subtraction, integration, division or the combination thereof. In the embodiment, a sampling frequency, of the reference voltage signal R1 and the first error signal E1 is fc, and a sampling frequency of the switching signal U1 is fc*256. Therefore, the first error signal E1 is an average value (an average of 256 points) of the switching signal U1 subtracted from reference voltage signal R1 (by performing subtraction).

In the embodiment, the computation frequency of the error computation unit 120 is a constant frequency greater than the frequency of the triangle wave signal S1. For example, the computation frequency of the error computation unit 120 is an integral multiple of the frequency of the triangle wave signal S1.

In step S107, the calibration unit 130 calibrates the triangle wave signal S1 according to the first error signal E1 into a calibrated triangle wave signal S1'. The calibration procedure performed by the calibration unit 130 may be an inverse function of the computation procedure performed by the error computation unit 120. For example, the error computation unit 120 performs subtraction, and the calibration unit 130 correspondingly performs addition.

Figure 4A:
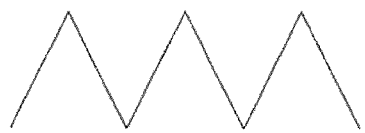
FIG. 4A is a waveform of a triangle wave signal before calibration.
Figure 4B:
FIGS. 4B to 4D are possible waveforms of a calibrated triangle wave signal.
Figure 4C:
Figure 4D:

FIG. 4A shows a waveform of the triangle wave signal S1 before calibration. FIGS. 4B to 4D show the possible waveforms of the calibrated triangle wave signal S1'. Referring to FIGS. 4A to 4D, since the calibrated triangle wave signal S1' refers to contents of the first error signal E1, the calibrated triangle wave signal S1' may be a non-symmetrical or non-periodical changing form.

In step S108, it is determined whether the feedback number is greater than or equal to k. That is to say, it is determined whether the feedback number reaches k. Step S110 is performed when the feedback number is greater than or equal to k, or else step S109 is performed and backed to step S104 when the feedback number is not greater than or equal to k.

In step S109, the feedback number is added by 1, and step S104 is iterated. Step S105 of outputting the switching signal U1, step S106 of feeding back the switching signal U1 and calculating the first error signal E1, and step S107 of calibrating the triangle wave signal S1 are repeated for a k number of times. Step S110 is only performed when the feedback number is greater than or equal to k.

Figure 5:
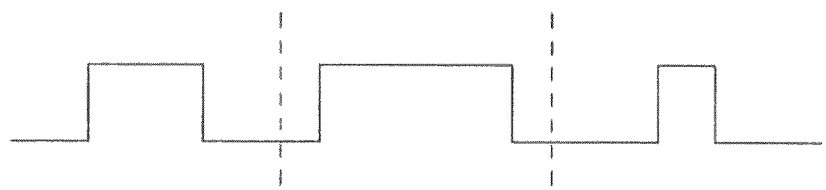
FIG. 5 is a waveform of a switching signal after multiple feedback and calibration procedures.

FIG. 5 shows a waveform of a switching signal U1 processed by multiple feedback and calibration procedures. Due to the multiple feedback and calibration procedures performed, the switching signal U1 may be a non-symmetrical or non-periodical changing form.

In steps S110 to S111, a pulse width of the switching signal U1 is continuously calculated, and a logic signal is generated to the switching circuit to complete the process of the frequency converter 100.

With the frequency converter 100 and the switching method thereof, the switching signal U1 may provide an enhanced accuracy through the feedback and calibration procedures. While enhancing the accuracy of the switching signal U1, neither the switching frequency of the triangle wave signal S1 nor switching losses are increased. Thus, the frequency converter 100 may satisfy both high accuracy and low switching loss requirements.

Second Embodiment

Figure 6:
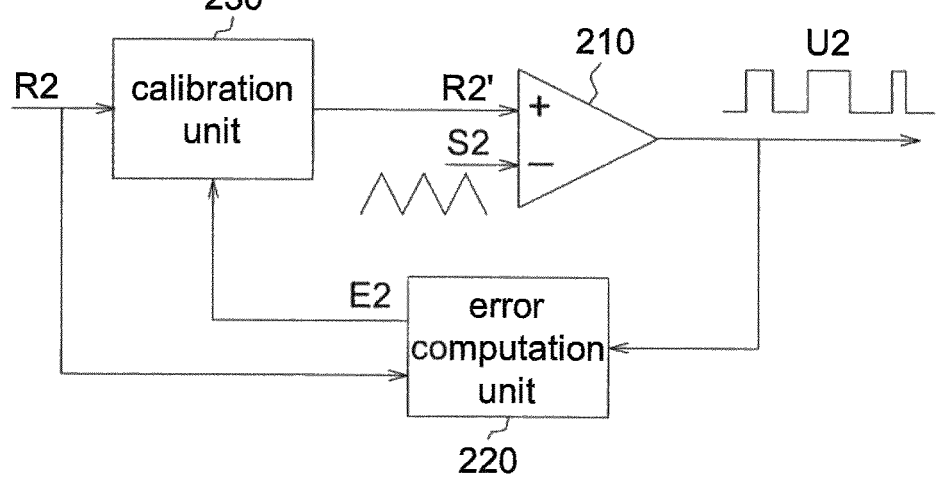
FIG. 6 is a schematic diagram of a frequency converter according to a second embodiment.
Figure 7:
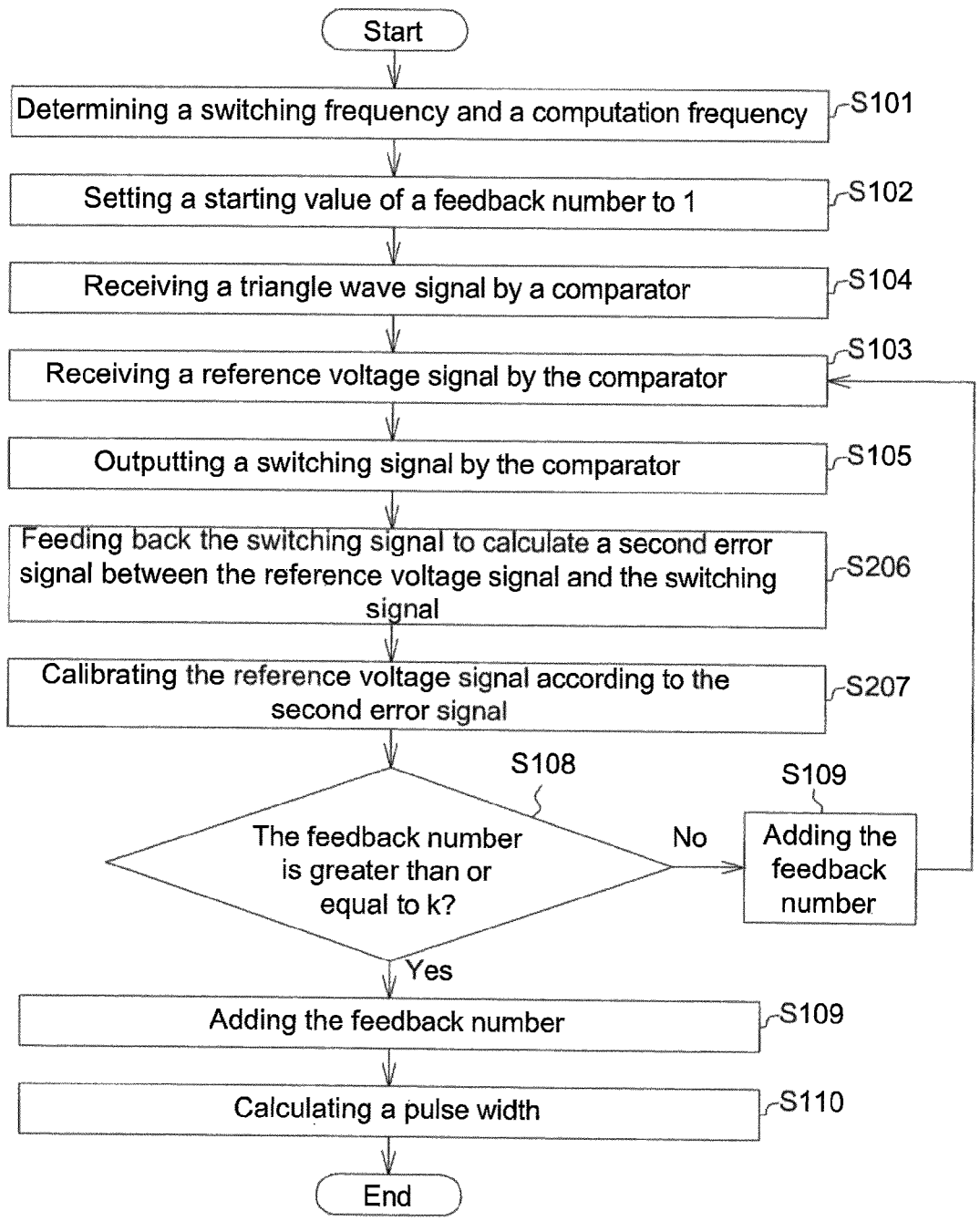
FIG. 7 is a flowchart of a switching method for the frequency converter in FIG. 6.

Referring to FIGS. 6 to 7, FIG. 6 shows a frequency converter 200 according to a second embodiment. FIG. 7 shows a switching method for the frequency converter 200. A main difference of the frequency converter 200 and the switching method thereof of the second embodiment from the frequency converter 100 and the switching method thereof of the first embodiment is a target of calibration. Other details are the same as those in associated descriptions, and shall be omitted herein.

As shown in FIGS. 6 and 7, in step S105, a switching signal U2 is outputted by a comparator 210.

In step S206, the switching signal U2 is fed back to an error computation unit 220 to calculate a second error signal E2 by computing a reference voltage signal R2 and the switching signal U2.

In step S207, a calibration unit 230 calibrates the reference voltage signal R2 according to the second error signal E2 into a calibrated reference voltage signal R2'.

Step S105 of outputting the switching signal U2, step S206 of feeding back the switching signal U2 and calculating the second error signal E2, and step S207 of calibrating the reference voltage signal R2 are repeated for a k number of times. Steps S110 and S111 are performed when the feedback number is greater than or equal to k.

With the frequency converter 200 and the switching method thereof, the switching signal U2 may be provided with an enhanced accuracy through the feedback and calibration procedures. While enhancing the accuracy of the switching signal U2, neither the switching frequency of the triangle wave signal S2 nor switching losses are increased. Thus, the frequency converter 100 may satisfy both high accuracy and low switching loss requirements.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A switching method for a frequency converter, comprising:
    receiving a reference voltage signal by a comparator;
    receiving a triangle wave signal by the comparator;
    outputting a switching signal by the comparator;
    feeding back the switching signal to calculate an error signal by computing the reference voltage signal and the switching signal; and
    calibrating the triangle wave signal or the reference voltage signal according to the error signal.

2. The switching method according to claim 1, wherein the step of calculating the error signal is performed according to a computation frequency which is greater than a switching frequency of the triangle wave signal.

3. The switching method according to claim 2, wherein the computation frequency is an integral multiple of the switching frequency.

4. The switching method according to claim 2, wherein the switching frequency is a constant frequency.

5. The switching method according to claim 2, wherein the computation frequency is a constant frequency.

6. The switching method according to claim 1, wherein the step of outputting the switching signal, the step of feeding back the switching signal and calculating the error signal, and the step of calibrating the triangle wave signal or the reference voltage signal are repeated for a plurality number of times.

7. The switching method according to claim 1, wherein the calibrated triangle wave signal is a non-periodical changing form.

8. The switching method according to claim 1, wherein the switching signal is a non-symmetrical form.

9. The switching method according to claim 1, wherein the switching signal is a non-periodical changing form.

10. A frequency converter, comprising:
- a comparator, for receiving a reference voltage signal and a triangle wave signal, and outputting a switching signal;
- an error computation unit, for calculating an error signal by computing the reference voltage signal and the switching signal after the switching signal is fed back to the error computation unit; and
- a calibration unit, for calibrating the triangle wave signal or the reference voltage signal according to the error signal.

11. The frequency converter according to claim 10, wherein the error computation unit computes according to a computation frequency greater than a switching frequency of the triangle wave.

12. The frequency converter according to claim 11, wherein the computation frequency is an integral multiple of the switching frequency.

13. The frequency converter according to claim 11, wherein the switching frequency is a constant frequency.

14. The frequency converter according to claim 11, wherein the computation frequency is a constant frequency.

15. The frequency converter according to claim 10, wherein the comparator, the error computation unit and the calibration unit repeat corresponding processes for a plurality number of times.

16. The frequency converter according to claim 10, wherein the calibrated triangle wave signal is a non-periodical changing form.

17. The frequency converter according to claim 10, wherein the switching signal is a non-symmetrical form.

18. The frequency converter according to claim 10, wherein the switching signal is a non-periodical changing form.

* * * * *